(12) United States Patent
Park

(10) Patent No.: US 7,285,813 B2
(45) Date of Patent: Oct. 23, 2007

(54) METAL-INSULATOR-METAL CAPACITOR AND METHOD FOR MANUFACTURING THE SAME

(75) Inventor: Sang-Hoon Park, Suwon (KR)

(73) Assignee: Samsung Electronics Co., Ltd. (KR)

( * ) Notice: Subject to any disclaimer, the term of this patent is extended or adjusted under 35 U.S.C. 154(b) by 77 days.

(21) Appl. No.: 11/265,574

(22) Filed: Nov. 2, 2005

(65) Prior Publication Data

US 2006/0054995 A1 Mar. 16, 2006

Related U.S. Application Data

(62) Division of application No. 10/762,437, filed on Jan. 22, 2004, now Pat. No. 6,989,313.

(30) Foreign Application Priority Data

Mar. 10, 2003 (KR) ................. 2003-14675

(51) Int. Cl.
*H01L 21/108* (2006.01)
(52) U.S. Cl. ............. 257/296; 257/306; 257/311; 257/532; 257/E27.085
(58) Field of Classification Search ............. 257/306, 257/532, 296, 311, E27.085
See application file for complete search history.

(56) References Cited

U.S. PATENT DOCUMENTS

| | | | |
|---|---|---|---|
| 6,180,976 B1 * | 1/2001 | Roy ........................... | 257/306 |
| 6,204,116 B1 * | 3/2001 | Pang ......................... | 438/253 |
| 6,259,128 B1 * | 7/2001 | Adler et al. ................ | 257/301 |
| 6,271,082 B1 * | 8/2001 | Hou et al. .................. | 438/250 |
| 6,342,734 B1 * | 1/2002 | Allman et al. ............. | 257/758 |
| 6,461,914 B1 * | 10/2002 | Roberts et al. ............ | 438/253 |
| 6,500,724 B1 * | 12/2002 | Zurcher et al. ............ | 438/384 |
| 6,576,526 B2 * | 6/2003 | Kai et al. ................... | 438/393 |
| 6,583,491 B1 * | 6/2003 | Huang et al. .............. | 257/532 |
| 6,635,498 B2 * | 10/2003 | Summerfelt et al. .......... | 438/3 |
| 6,740,974 B2 * | 5/2004 | Yoshitomi .................. | 257/751 |
| 6,777,776 B2 * | 8/2004 | Hieda ........................ | 257/532 |
| 6,885,081 B2 * | 4/2005 | Morimoto .................. | 257/532 |
| 6,916,722 B2 * | 7/2005 | Huang et al. .............. | 438/396 |
| 7,118,985 B2 * | 10/2006 | Allman et al. ............ | 438/396 |
| 2001/0019144 A1* | 9/2001 | Roy ........................... | 257/296 |
| 2002/0197844 A1* | 12/2002 | Johnson et al. ............ | 438/618 |
| 2003/0008467 A1* | 1/2003 | Kai et al. ................... | 438/393 |
| 2003/0011043 A1* | 1/2003 | Roberts ...................... | 257/532 |
| 2003/0032206 A1* | 2/2003 | Hsu et al. ...................... | 438/3 |
| 2003/0042522 A1* | 3/2003 | Mikawa et al. ............ | 257/298 |
| 2003/0068858 A1* | 4/2003 | Allman et al. ............ | 438/253 |
| 2003/0211731 A1* | 11/2003 | Kai et al. ................... | 438/638 |
| 2003/0232481 A1* | 12/2003 | Huang et al. .............. | 438/396 |
| 2004/0126984 A1* | 7/2004 | Son et al. ................... | 438/396 |
| 2004/0201057 A1* | 10/2004 | Lien et al. .................. | 257/306 |
| 2005/0062130 A1* | 3/2005 | Ciancio et al. ............. | 257/532 |

\* cited by examiner

*Primary Examiner*—Mary Wilczewski
*Assistant Examiner*—Toniae M Thomas
(74) *Attorney, Agent, or Firm*—F. Chau & Assoc., LLC

(57) ABSTRACT

A capacitor has a lower electrode formed on an insulation layer, a dielectric layer formed on the lower electrode, an upper electrode layer formed on the dielectric layer, and a first protection layer pattern formed on the upper electrode layer. The upper electrode layer is etched using the first protection layer pattern to form an upper electrode. A second protection layer is formed enclosing the dielectric layer, the upper electrode and the first protection layer pattern.

8 Claims, 8 Drawing Sheets

METAL-INSULATOR-METAL CAPACITOR AND METHOD FOR MANUFACTURING THE SAME

This is a divisional of application Ser. No. 10/762,437, filed on Jan. 22, 2004, now U.S. Pat. No. 6,989,313, the disclosure of which in its entirety is incorporated by reference herein.

BACKGROUND OF THE INVENTION

1. Technical Field

This disclosure relates to a metal-insulator-metal (MIM) capacitor and a method for manufacturing the same. More particularly, the invention relates to a MIM capacitor including at least one protection layer to provide a stable structure and improved electrical characteristics, and a method for manufacturing the same.

2. Discussion of the Related Art

Known semiconductor memory devices like a dynamic random access memory (DRAM), store information like data or program commands, read the stored information and store other information. A single memory device may have one transistor and one capacitor. For example, a 16 megabyte DRAM is a highly integrated memory device having 16 million transistors and 16 million capacitors on one chip. The capacitor in the DRAM device may include a storage node, a cell plate and an interlayer insulation layer. The capacitance of a memory device having a capacitor may be improved by enhancing a static capacitance of the capacitor.

As the DRAM device has been highly integrated to over a giga-grade, an area allowed per a unit cell has been decreased so that the static capacitance of not less than about 25 µF/cell, which is necessary for operating the semiconductor device, needs to be ensured from a capacitor having an extremely small area. When a DRAM device is integrated to several mega-grades, a low permittivity material, like silicon oxide ($SiO_2$), silicon oxide/silicon nitride ($SiO_2$/$Si_3N_4$), etc., is used to form a thin film dielectric for the capacitor, and doped polysilicon is used as an electrode of the capacitor. Permittivity is also referred to as the dielectric constant ($\epsilon_r$) of a material. Polysilicon can be formed into a thin film in a stable process, and easily etched to form desired shapes. When the electrode of the capacitor is formed of the polysilicon, an area (A) of the capacitor may be increased and large capacitance (C) may be ensured.

Capacitors with flat structures have been replaced with box shaped or cylindrical shaped capacitors to ensure the static capacitance of the capacitor. Capacitors including hemisphere particles having increased effective surface area by forming bumps on a surface of the electrode are also known. The capacitor in which silicon is used as an upper electrode and a lower electrode is called a silicon-insulator-silicon (SIS) capacitor.

As the DRAM device has been integrated to giga-grade, it has been difficult to ensure enough capacitance by varying shapes of the capacitor. Accordingly, research has been conducted on a method of using high permittivity dielectrics as the thin film dielectric of the capacitor. While tantalum oxide ($Ta_2O_5$) has been researched as a high permittivity dielectric, for example, aluminum oxide ($Al_2O_3$), and hafnium oxide ($HfO_2$) have been recently discovered. Generally, silicon oxide ($SiO_2$) has a permittivity of about 3.9, and silicon oxide/silicon nitride ($SiO_2$/$Si_3N_4$) has a permittivity of about 7. The above two-component high permittivity dielectrics ($Ta_2O_5$, $Al_2O_3$, and $HfO_2$) have a permittivity of about 10 to 25.

In order to exhibit properties of the high permittivity material in the capacitor, it is necessary to prevent formation of a low permittivity material on an interface of the upper electrode and the lower electrode. Silicon, a conventional material for the electrodes, is easily oxidized to form an interfacial oxide film at the temperature for depositing the high permittivity material, which leads to difficulty in securing the capacitance of the capacitor. Therefore, a noble metal such as platinum (Pt), ruthenium (Ru), etc. or a heat-resistant metal such as copper (Cu), tungsten (W), tungsten nitride (WN), titanium nitride (TiN), etc is recommended to form the electrodes of the capacitor. On the other hand, with the electrodes including the noble metal or the heat-resistant metal, it is difficult to increase the surface area of the electrodes, and, although the metals have excellent dielectric characteristics, their use is limited. The heat-resistant metal electrodes have poor oxidation characteristics that further limits use of the heat-resistant metal electrodes. A MIM capacitor may have upper and lower electrodes, which are made of the noble metal or the heat-resistant metal.

Aluminum (Al) or aluminum alloy has been used as a material for a connection line of the semiconductor device. Also, research has been performed in connection with manufacturing a semiconductor device including a metal wiring and a MIM capacitor using copper, which has a lower specific resistance than aluminum. The semiconductor device using copper as a contact or as the lower electrode can be manufactured using a damascene process.

FIG. 1A to FIG. 1D are cross-sectional views illustrating a known method for manufacturing a semiconductor device including a MIM capacitor.

Referring to FIG. 1A, an insulation layer 15 is formed of oxide on a semiconductor substrate 10, and portions of the insulation layer 15 are etched using a photolithography process to form an opening (not shown) in the insulation layer 15.

A first metal layer (not shown) is formed of copper on the insulation layer 15 and fills the opening. The first metal layer is polished using a chemical mechanical polishing (CMP) process to form a first metal layer pattern 20 in the opening. The first metal layer pattern 20 serves as the lower electrode of the MIM capacitor.

Referring to FIG. 1B, an upper portion of the first metal layer pattern 20 is etched using a reactive ion etching (RIE) process or a wet etching process. A conductive oxidation protection layer pattern 25 is formed on the first metal layer pattern 20 to complete the lower electrode of the MIM capacitor.

A dielectric layer 30, a second metal layer 35 and an etch stop layer 40 are sequentially formed on the lower electrode of the MIM capacitor and the insulation layer 15. A first photoresist layer (not shown) is coated on the etch stop layer 40, and the first photoresist layer is patterned using a photolithography process to form a first photoresist pattern 45 on the etch stop layer 40.

Referring to FIG. 1C, the etch stop layer 40 and the second metal layer 35 are sequentially etched using the first photoresist pattern 45 as an etch mask to form an upper electrode 50 of the MIM capacitor, and an etch stop layer pattern 55 on the upper electrode 50. The first photoresist pattern 45 is then removed, thereby forming the MIM capacitor.

An interlayer insulation layer (ILD) 60 is formed on the resulting structure including the MIM capacitor. A second photoresist layer (not shown) is coated on the interlayer insulation layer 60. The second photoresist layer is patterned using a photolithography process to form a second photoresist pattern 65 on the interlayer insulation layer 60.

Referring to FIG. 1D, the interlayer insulation layer 60 and the etch stop layer pattern 55 are partially etched using the second photoresist pattern 65 as an etch mask to form via holes (not shown) in the interlayer insulation layer 60, exposing the conductive oxidation protection layer pattern 25 and the upper electrode 50 of the MIM capacitor.

The second photoresist pattern 65 is removed, and the second metal layer (not shown) is formed of tungsten on the interlayer insulation layer 60 and fills the via holes. The second metal layer is polished using a chemical mechanical polishing process to form via contacts 70 in the via holes to connect the MIM capacitor to metal wiring.

In known methods for manufacturing the semiconductor device including the MIM capacitor, when the etch stop layer pattern and the upper electrode are formed using the photoresist pattern as the etch mask, the dielectric layer positioned under the upper electrode is partially removed, which can result in a failure of the capacitor. Additionally, when the etch stop layer pattern and the upper electrode are formed using known methods, the sidewalls of the upper electrode are exposed and subject to damage that can result in the generation of a leakage current. Further, when each structure of the MIM capacitor is formed by an etching process, the structures may be partially damaged during the etching process, resulting in an unstable MIM capacitor structure.

SUMMARY OF THE INVENTION

In accordance with an embodiment of the present invention, a capacitor comprises a lower electrode, a dielectric layer formed on the lower electrode and including a protruding portion, an upper electrode formed on the protruding portion of the dielectric layer, a first protection layer pattern formed on the upper electrode, and a second protection layer formed on the first protection layer pattern.

The lower electrode may comprise one of copper and aluminum, and the second protection layer may comprise one of silicon nitride and silicon carbide.

The thickness difference between the protruding portion and a non-protruding portion of the dielectric layer is substantially identical to the thickness of the first protection layer pattern or the thickness of the second protection layer. The upper electrode may include one of titanium nitride and tantalum nitride, and the dielectric layer may comprise one of oxide, nitride or a composite of oxide and nitride. Each of the first protection layer pattern and the second protection layer may include one of silicon nitride and silicon carbide. The first protection layer pattern may have a thickness of about 300 Å to about 700 Å and the second protection layer may have a thickness of about 200 Å to about 700 Å. The second protection layer may be formed at least from a sidewall of the first protection layer pattern to a sidewall of the protruding portion of the dielectric layer.

In accordance with an embodiment of the present invention, a method for manufacturing a capacitor includes forming a lower electrode in an insulation layer, forming a dielectric layer on the lower electrode, forming an upper electrode layer on the dielectric layer, forming a first protection layer pattern on the upper electrode layer, etching the upper electrode layer using the first protection layer pattern as an etching mask to form an upper electrode, and forming a second protection layer enclosing the dielectric layer, the upper electrode and the first protection layer pattern.

The first protection layer pattern and the dielectric layer adjacent the upper electrode may be partially etched during etching of the upper electrode, and a thickness of the first protection layer pattern remaining after partial etching may be substantially identical to a thickness of the dielectric layer removed by the partial etching. A thickness of the first protection layer pattern remaining after partial etching may be substantially identical to a thickness of the dielectric layer remaining after the partial etching. A thickness of the second protection layer may be substantially identical to a thickness of the dielectric layer removed by partial etching. A thickness of the second protection layer may be substantially identical to a thickness of the dielectric layer remaining after partial etching.

In accordance with an embodiment of the present invention, a method for manufacturing a semiconductor device includes forming a first insulation layer is formed on a substrate, forming a lower wiring and a lower electrode in the first insulation layer, forming a dielectric layer on the first insulation layer including the lower wiring and the lower electrode, forming a conductive layer on the dielectric layer, forming a first protection layer on the conductive layer to form a first protection layer pattern on the conductive layer, etching the conductive layer using the first protection layer pattern as an etch mask to form an upper electrode on a portion of the dielectric layer over the lower electrode, forming a second protection layer on the dielectric layer and on the first protection layer pattern, forming a second insulation layer on the second protection layer, forming a first contact contacting the lower wiring through the second insulation layer, forming a second contact contacting the upper electrode through the second insulation layer, the second protection layer and the first protection layer pattern, and forming a first upper wiring is formed on the first contact, and a second upper wiring on the second contact.

The first protection layer pattern and the dielectric layer adjacent the upper electrode may be partially etched during etching of the conductive layer so that the portion of the dielectric layer positioned on the lower electrode protrudes. A thickness of the first protection layer pattern remaining after partial etching and a thickness of the second protection layer remaining after the partial etching may be substantially identical to a thickness difference between the portion of the dielectric layer positioned on the lower electrode and a portion of the dielectric layer adjacent the upper electrode. The second protection layer may be formed on the portion of the dielectric layer positioned on the lower electrode, a sidewall of the upper electrode and a sidewall of the first protection layer pattern. The first upper wiring and the second upper wiring may comprise one of copper and aluminum.

The first protection layer pattern and the second protection layer can improve the unit capacitance of the MIM capacitor because the first protection layer pattern and the second protection layer can prevent consumption of the upper electrode and the dielectric layer caused by a plasma employed in an etching process for forming the upper electrode of the MIM capacitor. Thus, the generation of leakage current from the upper electrode may be prevented while the electrical characteristics of the MIM capacitor can be improved. Additionally, because the upper electrode can be formed using the first protection layer pattern as an etching mask, the production of metallic by-products during the etching process can be prevented. Further, since the second protection layer can prevent deformation of the upper electrode, and the MIM capacitor can have a more stable structure. Furthermore, second protection layer can compensate for the consumption of the dielectric layer, thereby accomplishing subsequent processes for manufacturing the semiconductor device with enhanced stability and safety.

BRIEF DESCRIPTION OF THE DRAWINGS

Preferred embodiments of the invention can be understood in more detail from the following descriptions taken in conjunction with the accompanying drawings, in which.

DETAILED DESCRIPTION OF THE PREFERRED EMBODIMENTS

Preferred embodiments of the present invention now will be described below in more detail with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art. The relative thickness of layers in the illustrations may be exaggerated for purposes of describing embodiments of the present invention.

Figure 1A:
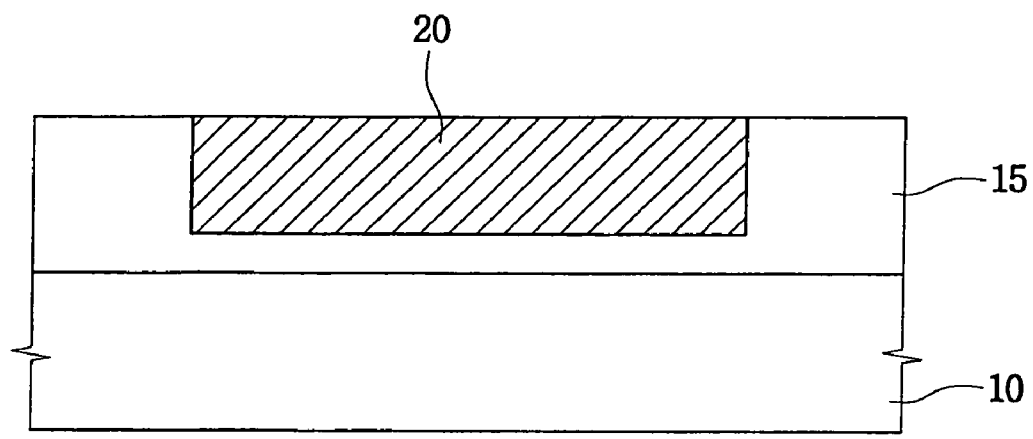
FIG. 1A to FIG. 1D are cross-sectional views illustrating a method for manufacturing a conventional MIM capacitor.
Figure 1B:
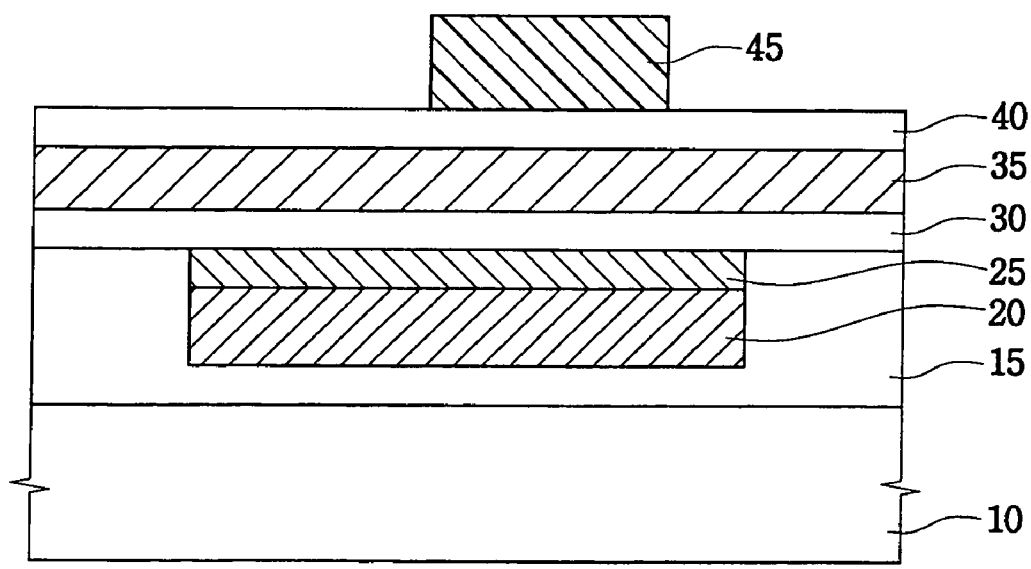
Figure 1C:
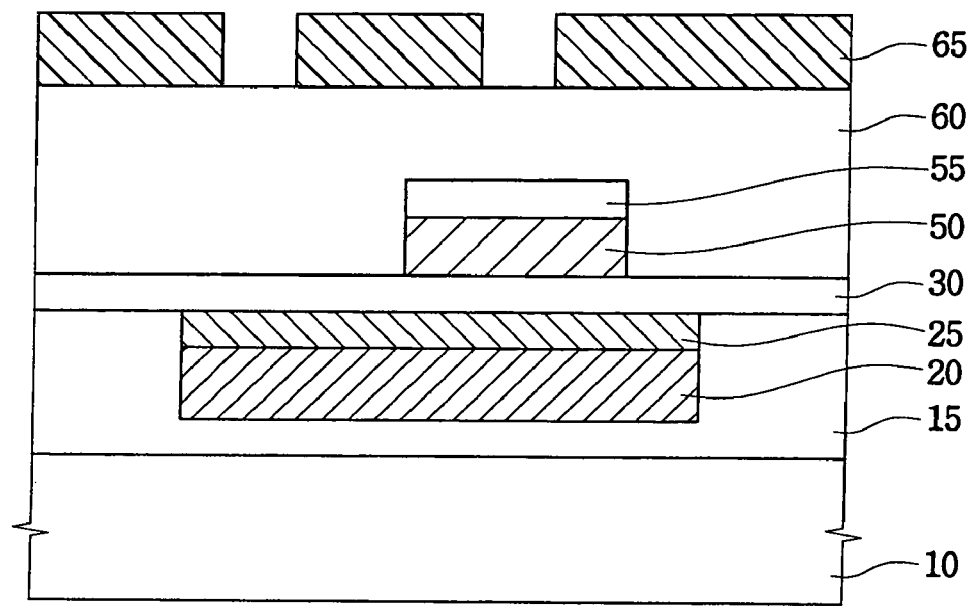
Figure 1D:
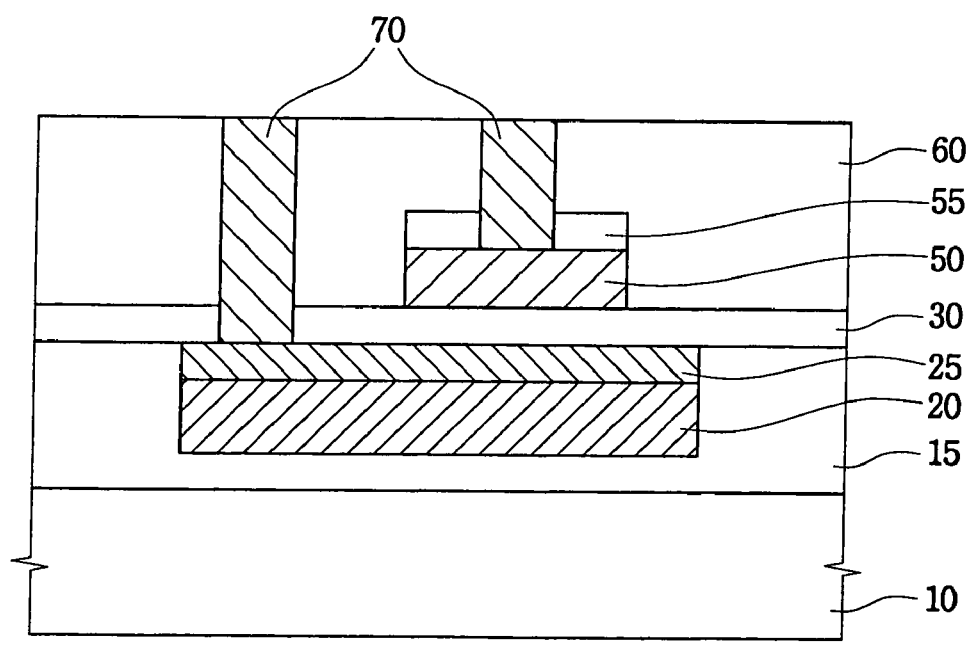
Figure 2:
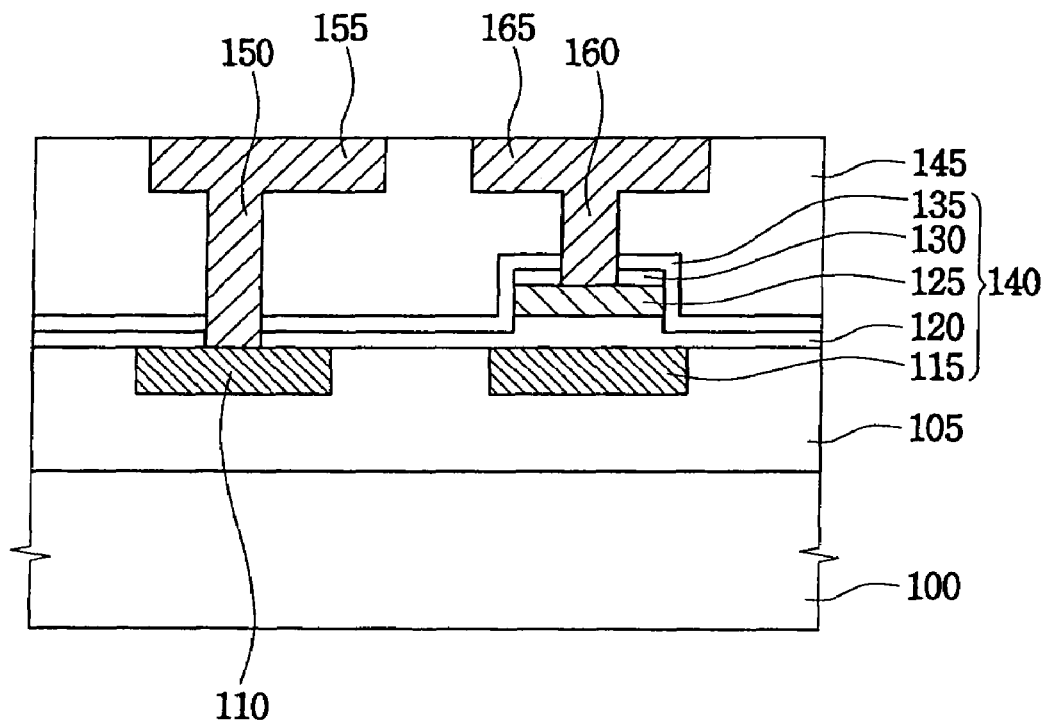
FIG. 2 is a cross-sectional view showing a semiconductor device including a MIM capacitor according to an embodiment of the present invention.

FIG. 2 is a cross-sectional view illustrating a semiconductor device including a MIM capacitor according to an embodiment of the present invention.

Referring to FIG. 2, the semiconductor device includes a MIM capacitor 140 formed on a semiconductor substrate 100 where a first insulation layer 105 and a second insulation layer 145 are formed.

The first insulation layer 105 formed on the semiconductor substrate 100 includes, for example, silicon oxide or silicon nitride. A transistor structure (not shown) including a metal oxide semiconductor (MOS) transistor is formed on the semiconductor substrate 100 and the first insulation layer 105 is formed on the semiconductor substrate 100 to cover the transistor structure. A top face of the first insulation layer 105 is planarized using an etch-back process or a chemical mechanical polishing (CMP) process.

The MIM capacitor 140 includes a second conductive pattern 115, a dielectric layer 120, a third conductive pattern 125, a first protection layer pattern 130, and a second protection layer pattern 135.

The second conductive pattern 115 is located in the first insulation layer 105 to serve as a lower electrode of the MIM capacitor 140. The dielectric layer 120 is formed on the second conductive pattern 115 and on the first insulation layer 105. The third conductive pattern 125 is formed on a portion of the dielectric layer 120 to serve as an upper electrode of the MIM capacitor 140. The first protection layer pattern 130 is formed on the third conductive pattern 125. The second protection layer 135 is formed to enclose the dielectric layer 120, the third conductive pattern 125 and the first protection layer pattern 130.

Figure 3A:
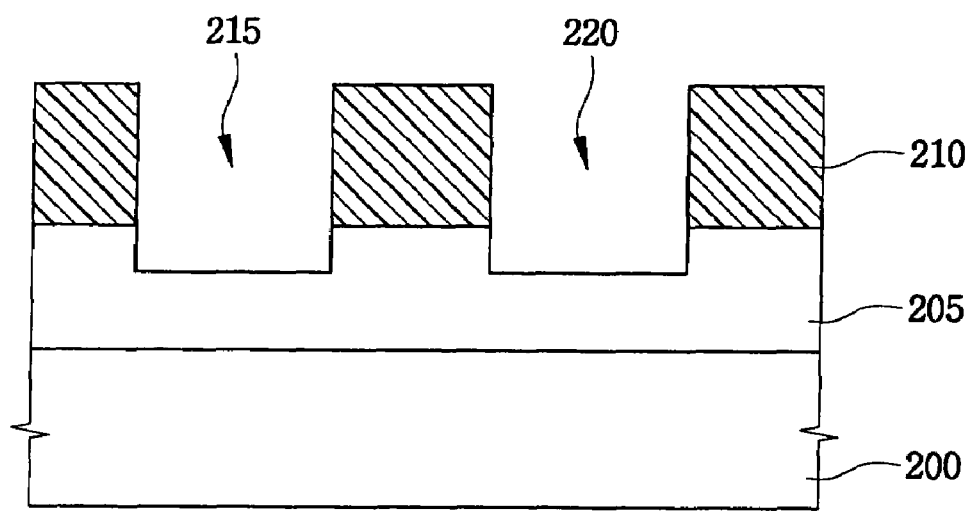
FIGS. 3A to 3G are cross-sectional views illustrating a method for manufacturing a semiconductor device including a MIM capacitor according to an embodiment of the present invention.

As shown in FIG. 3A, first and second trenches 215 and 220 are provided in the first insulation layer 205 (105 in FIG. 2) for a lower metal wiring of the semiconductor device and the lower electrode of the MIM capacitor 140, respectively. Referring to FIG. 2, a first conductive pattern 110 (225 in FIGS. 3B to 3G) and the second conductive pattern 115 (230 in FIGS. 3B to 3G) are formed in the first trench 215 and the second trench 220, respectively. The first conductive pattern 110 serves as the lower metal wiring of the semiconductor device while the second conductive pattern 115 functions as the lower electrode of the MIM capacitor 140. The first and second conductive patterns 110 and 115 include, for example, copper (Cu), tungsten (W), aluminum (Al), ruthenium (Ru), platinum (Pt), titanium (Ti), tungsten nitride ($W_xN_y$) or titanium nitride (TiN).

The dielectric layer 120 including, for example, an oxide film or a nitride film is formed on the first insulation layer 105 in which the first and second conductive patterns 110 and 115 are formed. The dielectric layer 120 may have a composite layer structure of an oxide film and a nitride film. A portion of the dielectric layer 120 positioned on the second conductive pattern 115 is upwardly protruded.

The third conductive pattern 125 corresponding to the upper electrode of the MIM capacitor 140 is formed on the protruded portion of the dielectric layer 120. The third conductive pattern 125 is formed using, for example, titanium nitride (TiN) or tantalum nitride (TaN) to have a thickness of about 200 Å to about 1,000 Å.

The first protection layer pattern 130 is formed on the third conductive pattern 125 using, for example, silicon nitride or silicon carbide. The first protection layer pattern 130 has a thickness of about 300 Å to about 700 Å. The first protection layer pattern 130 prevents damage to the third conductive pattern 125 that can be caused by a plasma used in an etching process for forming the third conductive pattern 125. The first protection layer pattern 130 also prevents the formation of metallic contaminants generated during the etching process when the third conductive pattern 125 including metal is formed.

The second protection layer 135 is formed using, for example, silicon nitride or silicon oxide. The second protection layer 135 having a uniform thickness is formed on the dielectric layer 120 to enclose the first protection layer pattern 130 and the third conductive pattern 125. The second protection layer 135 preferably has a thickness of about 200 Å to about 700 Å.

In accordance with an embodiment of the invention, the first protection layer pattern 130 protects the top face of the third conductive pattern 125 while the second protection layer 135 protects the sidewalls of the third conductive pattern 125 and the sidewalls of the projected portion of the dielectric layer 120. Further, the second protection layer 135 protects the sidewalls of the first protection layer pattern 130. Thus, even though the second protection layer 135 can be damaged during the etching process by using plasma, a leakage current from the third conductive pattern 125 may be prevented.

The second insulation layer 145 serving as an interlayer insulation layer is formed over the semiconductor substrate 100 on which the MIM capacitor 140, including the second conductive pattern 115, the dielectric layer 120, the third conductive pattern 125, the first protection layer pattern 130, and the first protection layer 135, is formed. The second insulation layer 145 is formed using, for example, silicon nitride or silicon oxide.

Figure 3B:
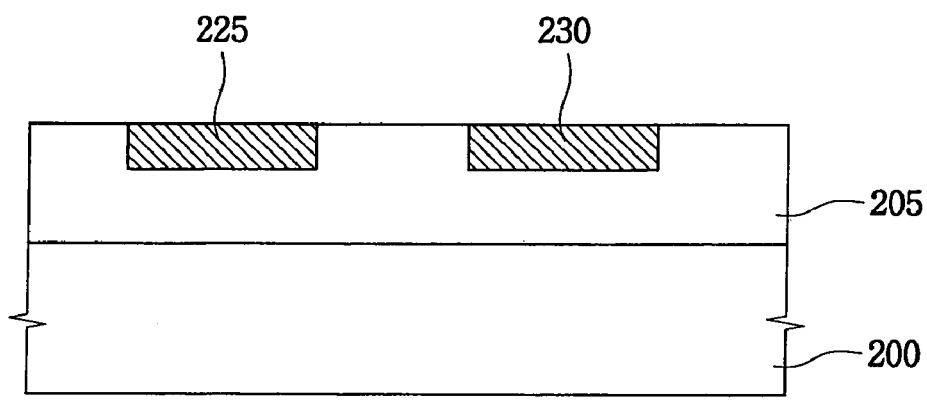
Figure 3C:
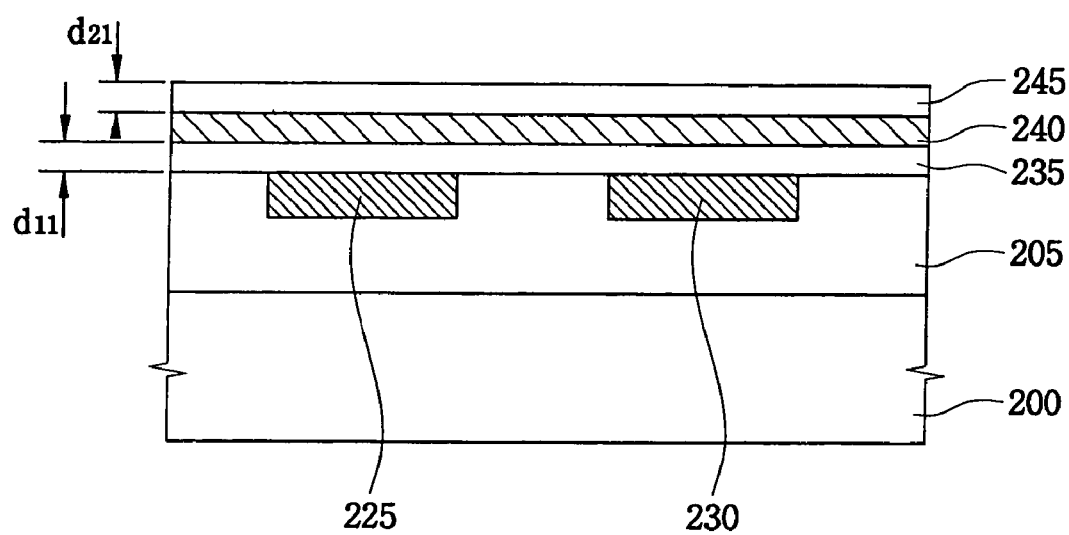
Figure 3D:
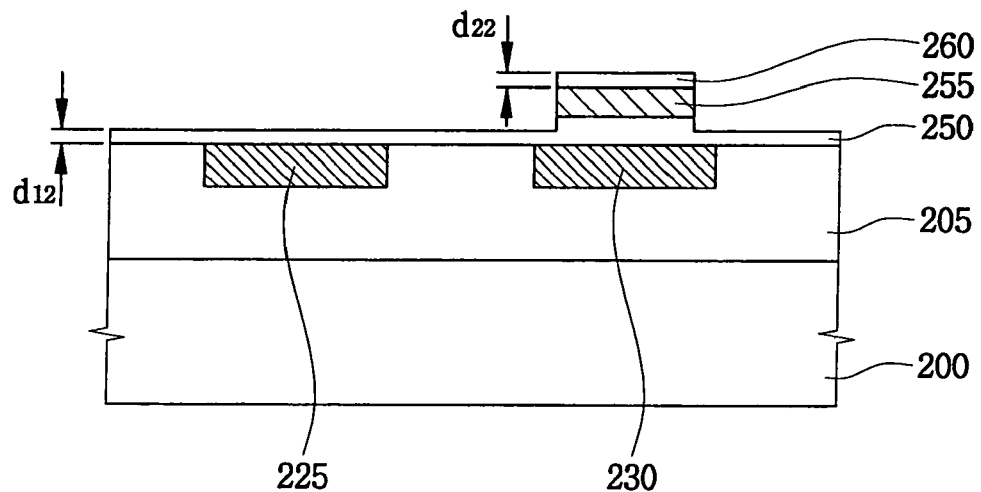
Figure 3E:
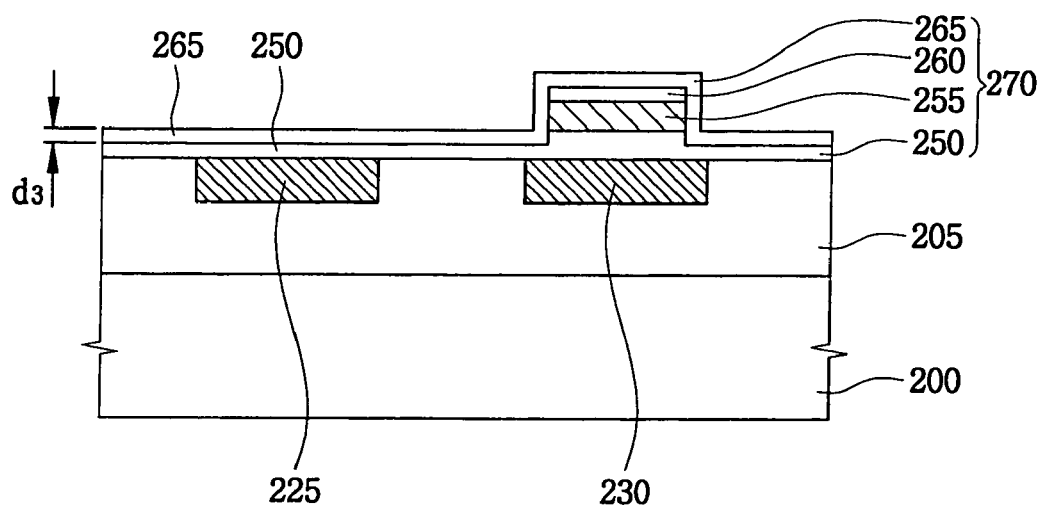
Figure 3F:
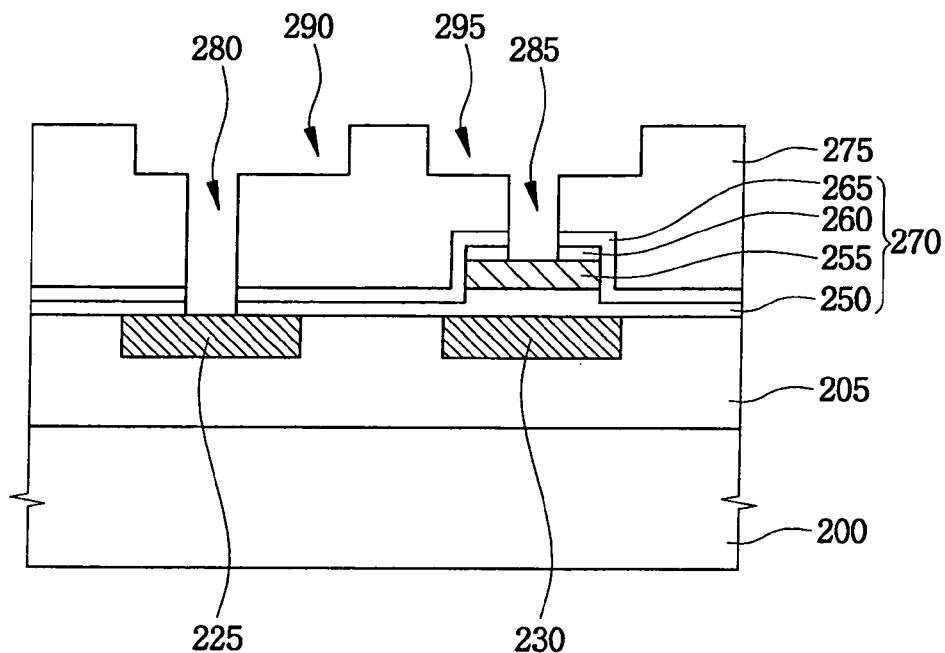

As shown in FIG. 3F, a first via hole 280 and a third trench 290 for a first contact 150 and a first upper wiring 155 (FIG. 2) are formed through a first portion of the second insulation layer 275 (145 in FIG. 2). In addition, a second via hole 285 and a fourth trench 295 for a second contact 160 and a second upper wiring 165 are formed through a second portion of the second insulation layer 275. The first via hole 280 is formed through the second insulation layer 275 to expose the first conductive pattern 225 (110 in FIG. 2) corresponding to the lower wiring buried in the portion of the first insulation layer 205 (105 in FIG. 2). The second via hole 285 is formed through the second insulation layer 275, the second protection layer 265 (135 in FIG. 2) and the first protection layer pattern 260 (130 in FIG. 2) to expose the third conductive pattern 255 (125 in FIG. 2) corresponding to the upper electrode of the MIM capacitor 270 (140 in FIG. 2).

The first and second contacts 150 and 160 (300 and 310 in FIG. 3G) are formed in the first and second via holes 280 and 285, respectively. The first and second contacts 150 and 160 include, for example, tungsten, titanium, titanium nitride or tantalum nitride.

The first and second upper wirings 155 and 165 (305 and 315 in FIG. 3G) are formed in the third and fourth trenches 290 and 295, respectively. The first and second upper wirings 155 and 165 include, for example, copper, tungsten, titanium, titanium nitride or tantalum. Accordingly, the first conductive pattern 110 corresponding to the lower electrode is electrically connected to the first upper wiring 155 through the first contact 150, and the MIM capacitor 140 is electrically connected to the second upper wiring 165 through the second contact 160.

According to an embodiment of the present invention, the second and third conductive patterns 115 and 125 serve as the lower and upper electrodes of the MIM capacitor 140, and also the second and third conductive patterns 115 and 125 are electrically connected to the second upper wiring 165 through the second contact 160. Therefore, the structures of the MIM capacitor 140 may be used to electrically connect the lower wirings to the upper wirings.

Hereinafter, a method for manufacturing the semiconductor device including the MIM capacitor according to an embodiment of the present invention will be described in detail.

FIGS. 3A to 3G are cross-sectional views illustrating the method for manufacturing the semiconductor device having the MIM capacitor shown in FIG. 2.

Referring to FIG. 3A, a first insulation layer 205 is formed on a semiconductor substrate 200 to cover a transistor structure (not shown), for example a MOS transistor, formed on the semiconductor substrate 200. The first insulation layer 205 is formed on the semiconductor substrate 200 using, for example, oxide or nitride, by a chemical vapor deposition (CVD) process or a physical vapor deposition (PVD) process. For example, the first insulation layer 205 is formed using silicon oxide or silicon nitride ($Si_xN_y$) such as middle temperature oxide (MTO), tetraethyl orthosilicate (TEOS), borophosphosilicate glass (BPSG) or undoped silicate glass (USG).

After a first photoresist film (not shown) is coated on the first insulation layer 205 using a spin coat process, the coated first photoresist film is exposed and developed to form a first photoresist pattern 210 on the first insulation layer 205. Here, the first photoresist pattern 210 selectively exposes portions of the first insulation layer 205 where a lower wiring and the lower electrode of the MIM capacitor will be formed in subsequent processes.

The exposed portions of the first insulation layer 205 are etched using the first photoresist pattern 210 as an etch mask, thereby forming a first and second trenches 215 and 220 in the first insulation layer 205. Each of the first and second trenches 215 and 220 has a predetermined width and depth. The first photoresist pattern 210 is removed from the first insulation layer 205 using, for example, an ashing process and a stripping process.

Referring to FIG. 3B, a first conductive layer (not shown) is formed on the first insulation layer 205 to fill up the first and second trenches 215 and 220 formed in the first insulation layer 205. The first conductive layer includes, for example, copper, tungsten, aluminum, ruthenium, platinum, titanium, tungsten nitride or titanium nitride. The first conductive layer is formed using a CVD process, a sputtering process or an electroplating process. When the first conductive layer includes copper, a barrier metal layer and a copper seed layer are formed in the first and second trenches 215 and 220 using a sputtering process. Then, a copper layer is formed on the copper seed layer by using the electroplating process, thereby forming the first conductive layer.

The first conductive layer is removed using an etch-back process or a CMP process until first insulation layer 205 is exposed so that first and second conductive patterns 225 and 230 are formed in the first and second trenches 215 and 220, respectively. Here, the first conductive pattern 225 serves as the lower wiring of a semiconductor device, and the second conductive pattern 230 functions as the lower electrode of the MIM capacitor.

Referring to FIG. 3C, a dielectric layer 235 is formed on the first insulation layer 205 including the first and second conductive patterns 225 and 230. The dielectric layer 235 is formed using, for example, silicon oxide, silicon nitride or a composite of silicon oxide and silicon nitride by a CVD process. In other words, the dielectric layer 235 includes a single oxide film, a single nitride film or a composite layer including an oxide film and a nitride film. The dielectric layer 235 has a predetermined thickness $d_{11}$ in accordance with the required capacitance of the MIM capacitor.

A second conductive layer 240 is formed on the dielectric layer 235 using, for example, titanium nitride or tantalum nitride. The second conductive layer 240 is formed by a CVD process to have a thickness of about 200 Å to about 1,000 Å. The second conductive layer 240 is patterned to form a third conductive pattern 255 (FIG. 3D) corresponding to the upper electrode of the MIM capacitor.

A first protection layer 245 is formed on the second conductive layer 240 using, for example, silicon nitride or silicon carbide (SiC). The first protection layer 245 is formed using a CVD process or a PVD process. The first protection layer 245 is preferably formed using a non-conductive material that prohibits the diffusion of copper. The first protection layer 245 is formed to have a thickness $d_{21}$ of about 300 Å to about 700 Å.

In an embodiment of the present invention, the first protection layer 245 is can be formed of a material that can be used in a damascene process for copper. Considering an amount of the first protection layer 245 consumed during successive etching of the second conductive layer 240 to form the upper electrode, the thickness $d_{21}$ of the first protection layer 245 is enough to ensure that a thickness $d_{12}$ of portions of the dielectric layer 250, not positioned under the third conductive pattern 255, is substantially identical to a thickness $d_{22}$ of the first protection layer pattern 260 remaining on the third conductive pattern 255 after the second conductive layer 240 is patterned. For this reason, the first protection layer 245 is formed to have the thickness $d_{21}$ of about 300 Å to about 700 Å. The thickness $d_{21}$ of the first protection layer 245 governs the conditions of a successive etching process for forming an upper wiring after the MIM capacitor is completed. Since a first protection layer pattern 260 is formed and used as an etching mask to form the third conductive pattern 255 corresponding to the upper electrode of the MIM capacitor, metallic by-products generated in a photolithography process, which are difficult to remove, are not produced.

Referring to FIG. 3D, after a second photoresist film (not shown) is coated on the first protection layer 245, the coated second photoresist film is exposed and developed to form a second photoresist pattern. The first protection layer 245 is patterned using the second photoresist pattern as an etching mask, thereby forming a first protection layer pattern 260 on the second conductive layer 240. The second photoresist pattern is then removed.

The second conductive layer 240 is etched using the first protection layer pattern 260 as an etching mask to form the third conductive pattern 255 on the dielectric layer 250. When the second conductive layer 240 is etched to form the third conductive pattern 255, the first protection layer pattern 260 and the dielectric layer 235 are also etched. The third conductive pattern 255 serves as the upper electrode of the MIM capacitor. The third conductive pattern 255 is formed on a portion of the dielectric layer 250 under which the second conductive pattern 230 corresponding to the lower electrode is positioned.

As described above, since the first protection layer 245 has the predetermined thickness $d_{21}$ depending the amounts of the first protection layer 245 and the dielectric layer 235 consumed during the formation of the third conductive pattern 255, the thickness $d_{22}$ of the first protection layer pattern 260 is substantially identical to the thickness $d_{12}$ of the etched dielectric layer 250 after etching the second conductive layer 240.

Referring to FIG. 3E, a second protection layer 265 is formed on the etched dielectric layer 250 and the first protection layer pattern 260 using a CVD process or a PVD process. The second protection layer 265 is formed using, for example, silicon nitride or silicon carbide to have a thickness $d_3$ of about 200 Å to about 700 Å. The second protection layer 265 covers the sidewalls of the first protection layer pattern 260, the sidewalls of the third conductive layer pattern 255, and the exposed sidewalls of the dielectric layer 250.

In accordance with an embodiment of the present invention, the second protection layer 265 compensates for the consumed amount of dielectric layer 250 during the formation of the third conductive pattern 255. Accordingly, subsequent manufacturing processes may be more stably performed. In addition, since the second protection layer 265 is formed on the exposed sidewalls of the first protection layer pattern 260, the third conductive pattern 255, and the dielectric layer 250 in accordance with the formation of the third conductive pattern 255, the MIM capacitor 270 is formed to have a more stable structure and the occurrence of a leakage current may be prevented, thereby improving characteristics of the MIM capacitor 270.

Referring to FIG. 3F, a second insulation layer 275 is formed on the resultant structure including the MIM capacitor 270 using, for example, oxide or nitride and a CVD process. The second insulation layer 275 may be formed using a material identical to that of the first insulation layer 205. Alternatively, the first insulation layer 205 and the second insulation layer 275 may be formed using different materials.

After a third photoresist film (not shown) is coated on the second insulation layer 275 using, for example, a spin coat process, the coated third photoresist film is exposed and developed to form a third photoresist pattern on the second insulation layer 275. The second insulation layer 275 is etched using the third photoresist pattern as an etching mask to form a first via hole 280 and a third trench 290 at one portion of the second insulation layer 275. The formation of the first via hole 280 and the third trench 290 exposes the first conductive pattern 225 corresponding to the lower wiring. At the same time, second via hole 285 and a fourth trench 295 can be formed at another portion of the second insulation layer 275 by etching the second insulation layer 275, the second protection layer 265 and the first protection layer pattern 260. The second via hole 285 and the fourth trench 295 expose the third conductive pattern 255 serving as the upper electrode of the MIM capacitor 270. Alternatively, the first and second via holes 280 and 285 are formed through the second insulation layer 275 by a first etching process, and then the second insulation layer 275 is etched by an additional etching process to form the third and fourth trenches 290 and 295 connected to the first and second via holes 280 and 285, respectively. In another alternative, the third and fourth trenches 290 and 295 may be formed prior to the first and second via holes 280 and 285, which can be secondarily formed using an additional etching process.

Figure 3G:
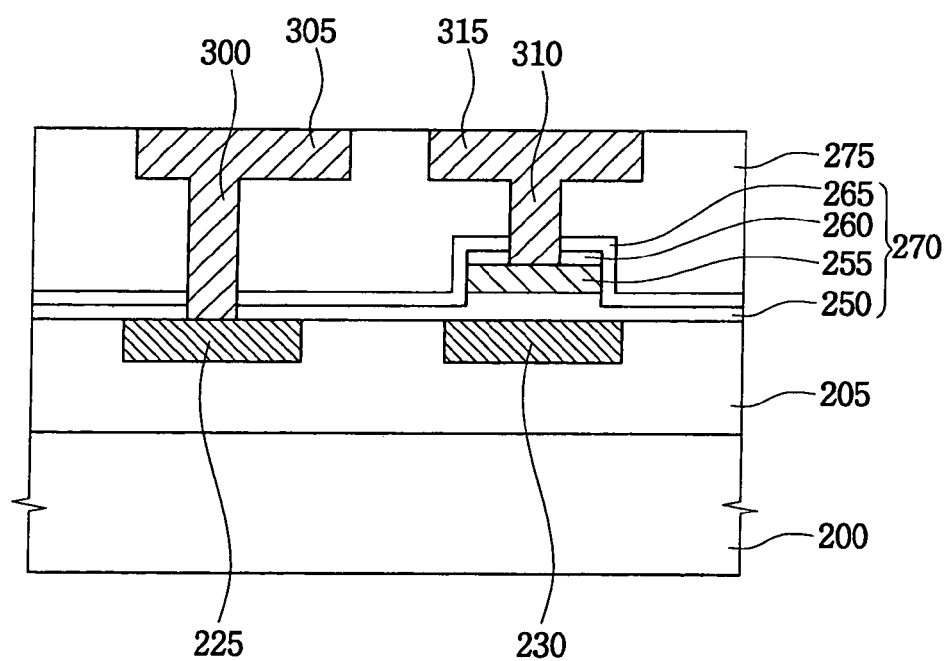

Referring to FIG. 3G, after the third photoresist pattern is removed, a third conductive layer (not shown) is formed on the second insulation layer 275 to fill up the first via hole 280, the second via hole 285, the third trench 290, and the fourth trench 295. The third conductive layer is formed using, for example, copper, tungsten, ruthenium, platinum, titanium, titanium nitride or tantalum nitride. The third conductive layer may be formed by a CVD process, a sputtering process or an electroplating process.

The third conductive layer may be removed using an etch-back process or a CMP process until the second insulation layer 275 is exposed, thereby forming first and second contacts 300 and 310 in the first and second via holes 280 and 285, respectively. The first and second contacts 300 and 310 respectively contact the first and third conductive patterns 225 and 255. At the same time, a first and second upper wirings 305 and 315 are respectively formed in the third and fourth trenches 290 and 295. Thus, the first conductive pattern 225 corresponding to the lower wiring is electrically connected to the first upper wiring 305 through the first contact 300 while the third conductive pattern 255 corresponding to the upper electrode of the MIM capacitor 270 is electrically connected to the second upper wiring 315 through the second contact 310. In addition, the second and third conductive patterns 230 and 255 of the MIM capacitor 270 may be used to connect the upper wiring to the lower wiring of the semiconductor device.

Figure 4:
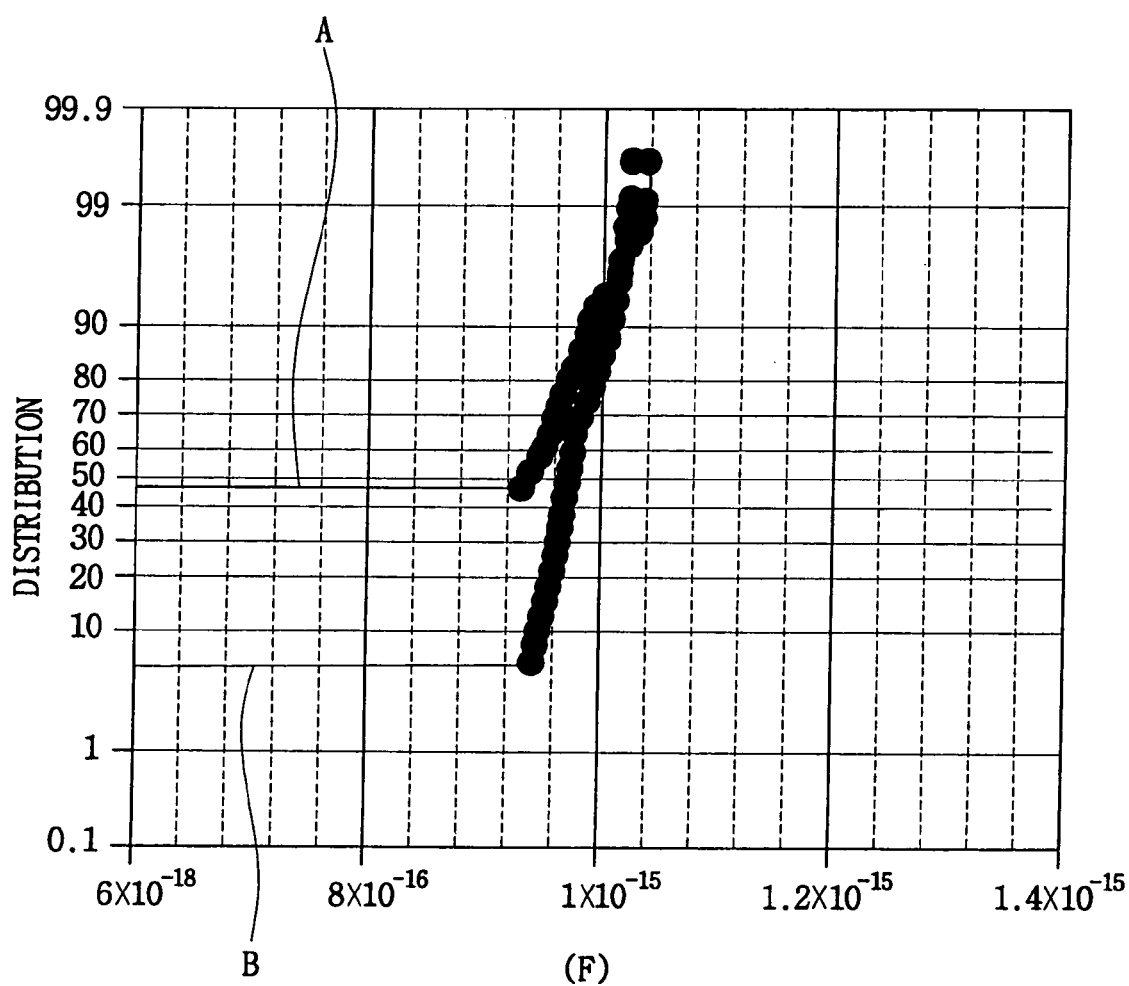
FIG. 4 is a graph illustrating the unit capacitance of a conventional MIM capacitor relative to the unit capacitance of a MIM capacitor according to an embodiment of the present invention.
Figure 5:
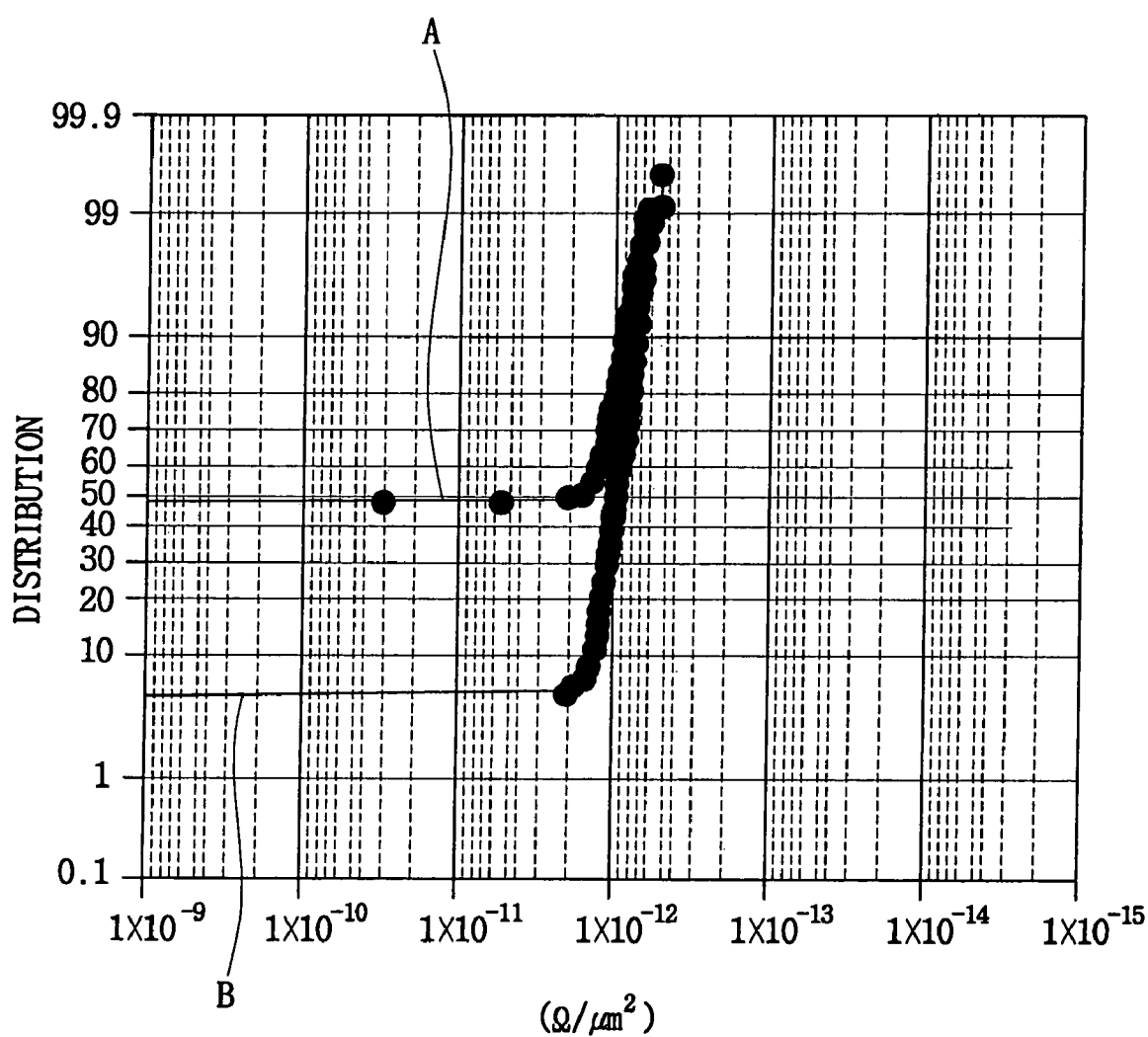
FIG. 5 is a graph illustrating electrical characteristics of a conventional MIM capacitor relative to electrical characteristics of a MIM capacitor according to an embodiment of the present invention.

FIG. 4 is a graph illustrating the unit capacitance of a conventional MIM capacitor relative to the unit capacitance of a MIM capacitor according to an embodiment of the present invention. FIG. 5 is a graph illustrating electrical characteristics of a conventional MIM capacitor relative to electrical characteristics of a MIM capacitor according to an embodiment of the present invention. In FIG. 4, a vertical axis represents the distributions of the unit capacitances of the MIM capacitors, and a horizontal axis represents different unit capacitance values of the MIM capacitors. In FIG. 5, a vertical axis represents leakage current distributions of the MIM capacitors and a horizontal axis represents different unit leakage current values of the MIM capacitors.

As shown in FIG. 4, the unit capacitance distribution A of a conventional MIM capacitor that does not include first and second protection layers has a large deviation from a standard unit capacitance value (for example, about $1\times10^{-15}$ F). However, the unit capacitance distribution B of the MIM capacitor having the first and second protection layers has a minute deviation from the standard value. As shown in FIG. 5, the leakage current distribution A of a conventional MIM capacitor has a large deviation from the a standard unit leakage current value (for example, about $1\times10^{-12}$ F $\Omega/\mu m^2$). However, the MIM capacitor according to an embodiment of the present invention has a small leakage current deviation from the standard value. Therefore, the MIM capacitor according to an embodiment of the present invention has improved electrical characteristics when compared with the conventional MIM capacitor.

According to an embodiment of the present invention, the first protection layer pattern and the second protection layer improve the unit capacitance of the MIM capacitor because the first protection layer pattern and the second protection layer can prevent consumption of the upper electrode and the dielectric layer caused by a plasma employed in an etching process for forming the upper electrode of the MIM capacitor. Thus, the generation of leakage current from the upper electrode can be prevented while the electrical characteristics of the MIM capacitor can be improved.

Additionally, because the upper electrode is formed using the first protection layer pattern as an etching mask, metallic by-products are not produced during the etching process. Further, since the second protection layer prevents deformation of the upper electrode, and the MIM capacitor can have a more stable structure.

Furthermore, the second protection layer can compensate for consumption of the dielectric layer so that subsequent processes for manufacturing the semiconductor device may be more stably performed.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A capacitor, comprising:
a lower electrode;
a dielectric layer formed on the lower electrode, the dielectric layer including a protruding portion;
an upper electrode formed on the protruding portion of the dielectric layer;
a first protection layer pattern formed on the upper electrode; and
a second protection layer formed on the first protection layer pattern, wherein a thickness difference between the protruding portion and a non-protruding portion of the dielectric layer is substantially identical to a thickness of the second protection layer.

2. The capacitor of claim 1, wherein the lower electrode comprises one of copper and aluminum, and the second protection layer comprises one of silicon nitride and silicon carbide.

3. The capacitor of claim 1, wherein the thickness difference between the protruding portion and the non-protruding portion of the dielectric layer is substantially identical to a thickness of the first protection layer pattern.

4. The capacitor of claim 1, wherein the upper electrode comprises one of titanium nitride and tantalum nitride, and the dielectric layer comprises one of oxide, nitride and a composite of oxide and nitride.

5. The capacitor of claim 1, wherein the first protection layer pattern and the second protection layer each comprise one of silicon nitride and silicon carbide.

6. The capacitor of claim 1, wherein the first protection layer pattern has a thickness of about 300 Å to about 700 Å and the second protection layer has a thickness of about 200 Å to about 700 Å.

7. The capacitor of claim 1, wherein the second protection layer is formed at least from a sidewall of the first protection layer pattern to a sidewall of the protruding portion of the dielectric layer.

8. A capacitor, comprising:
a lower electrode;
a dielectric layer formed on the lower electrode, the dielectric layer including a protruding portion;
an upper electrode formed on the protruding portion of the dielectric layer;
a first protection layer pattern formed on the upper electrode; and
a second protection layer formed on a top surface of the first protection layer pattern, and extending from the top surface to be directly formed on exposed sidewalls of the first protection layer pattern, the upper electrode and the dielectric layer.

* * * * *